US010063230B2

(12) United States Patent
Wang et al.

(10) Patent No.: US 10,063,230 B2
(45) Date of Patent: Aug. 28, 2018

(54) ELECTRONIC SWITCH WITH FORCE FEEDBACK FUNCTION

(71) Applicant: PixArt Imaging Inc., Hsin-Chu (TW)

(72) Inventors: Tsung-Fa Wang, Hsin-Chu (TW); Shih-Wei Kuo, Hsin-Chu (TW)

(73) Assignee: PixArt Imaging Inc., Hsin-Chu (TW)

( * ) Notice: Subject to any disclaimer, the term of this patent is extended or adjusted under 35 U.S.C. 154(b) by 163 days.

(21) Appl. No.: 15/176,143

(22) Filed: Jun. 7, 2016

(65) Prior Publication Data

US 2017/0302275 A1   Oct. 19, 2017

(30) Foreign Application Priority Data

Apr. 14, 2016  (TW) .............................. 105111604 A

(51) Int. Cl.
| | |
|---|---|
| H01F 27/42 | (2006.01) |
| H01F 37/00 | (2006.01) |
| H01F 38/00 | (2006.01) |
| H03K 17/969 | (2006.01) |
| H03K 17/98 | (2006.01) |
| H03K 17/972 | (2006.01) |
| H03K 17/97 | (2006.01) |

(52) U.S. Cl.
CPC ......... *H03K 17/969* (2013.01); *H03K 17/972* (2013.01); *H03K 17/98* (2013.01); *H03K 2017/9706* (2013.01)

(58) Field of Classification Search
USPC ....................................................... 327/517
See application file for complete search history.

(56) References Cited

U.S. PATENT DOCUMENTS

| | | | | |
|---|---|---|---|---|
| 2,962,561 | A * | 11/1960 | Neumann ................. | H03F 1/36 369/136 |
| 3,133,161 | A * | 5/1964 | Neumann ................. | H03F 1/36 369/133 |
| 9,298,285 | B2 * | 3/2016 | Mohindra ........... | G06F 3/03545 |
| 9,310,896 | B2 * | 4/2016 | Ji ............................. | G06F 3/033 |
| 9,423,911 | B2 * | 8/2016 | Kuo ..................... | G06F 3/0418 |
| 9,495,022 | B2 * | 11/2016 | Son ...................... | G06F 3/0416 |
| 2013/0201162 | A1 * | 8/2013 | Cavilia ............... | G06F 3/03545 345/179 |
| 2013/0271431 | A1 * | 10/2013 | Besperstov ......... | G06F 3/03545 345/179 |
| 2013/0342501 | A1 * | 12/2013 | Molne .................. | G06F 3/0414 345/174 |
| 2014/0306940 | A1 * | 10/2014 | Fukushima ........... | G06F 1/1626 345/179 |
| 2015/0015489 | A1 * | 1/2015 | Vaganov ............. | G06F 3/03545 345/158 |
| 2015/0015741 | A1 * | 1/2015 | Kim .................... | H04N 5/23293 348/239 |
| 2015/0091859 | A1 * | 4/2015 | Rosenberg .............. | G06F 3/044 345/174 |
| 2017/0068342 | A1 * | 3/2017 | Zimmerman ......... | G06F 3/0383 |

(Continued)

*Primary Examiner* — Adam Houston
(74) *Attorney, Agent, or Firm* — Winston Hsu

(57) ABSTRACT

An electronic switch with force feedback function includes a base, an actuating component and a. The actuating component is movably connected to the base, and includes a. The magnetic field generating module is disposed on the base, and provides a magnetic repulsive force to the magnetic unit for force feedback while the actuating component moves close to the base.

19 Claims, 8 Drawing Sheets

(56) References Cited

U.S. PATENT DOCUMENTS

2017/0277282 A1* 9/2017 Go .................... G06F 3/0346
2017/0293361 A1* 10/2017 Lee ..................... G06F 3/016
2017/0302275 A1* 10/2017 Wang ................. H03K 17/969
2017/0322674 A1* 11/2017 Rosenberg .......... G06F 3/03545

* cited by examiner

ELECTRONIC SWITCH WITH FORCE FEEDBACK FUNCTION

BACKGROUND OF THE INVENTION

1. Field of the Invention

The present invention relates to an electronic switch, and more particularly, to an electronic switch with force feedback function and capable of applying to the keyboard and the digital touch pen.

2. Description of the Prior Art

With the advanced technology, the conventional keyboard and mouse cannot suitable for actual demand of the distinctive application programs, and a plurality of input interfaces (such like the touch pad, the touch ball and the touch pen) is built to provide various operational function. The touch pen may utilize the resistance touch technique, the capacitance touch technique or the optical touch technique to detect a movement of the touch pen exerting on the working surface. The touch pen may further have the pressure detector utilized to detect pressure applied to the touch pen and the said pressure is transformed into the writing trace with corresponding width. However, the conventional touch pen cannot control hardness of the touch pen's brushwork, then design of a touch pen capable of adjusting the hardness of brushwork and transforming the brushwork into the corresponding writing trace is an important issue in the related touch technology industry.

SUMMARY OF THE INVENTION

The present invention provides an electronic switch with force feedback function and capable of applying to the keyboard and the digital touch pen for solving above drawbacks.

According to the claimed invention, an electronic switch with force feedback function includes a base, an actuating component and a magnetic field generating module. The actuating component is movably connected to the base, and the actuating component includes a magnetic unit. The magnetic field generating module is disposed on the base and adapted to provide a magnetic repulsive force for the magnetic unit, so as to generate an inverse feedback force while the actuating component moves close to the base.

According to the claimed invention, the actuating component is spaced from the base, and the actuating component is moved close to or away from the base in a unidirectional movable manner. The magnetic field generating module utilizes an electromagnetic unit to generate the magnetic repulsive force corresponding to the magnetic unit, and the magnetic field generating module adjusts an input current of the electromagnetic unit to vary a value of the magnetic repulsive force. The magnetic field generating module utilizes a permanent magnet unit to generate the magnetic repulsive force corresponding to the magnetic unit.

According to the claimed invention, the electronic switch further includes a covering component and a resilient component. The covering component is connected to the base. The covering component includes a contacting portion, and the actuating component is movably located between the covering component and the base. Two ends of the resilient component are respectively connected to the actuating component and the magnetic field generating module, so as to contact the actuating component against the contacting portion. The electronic switch further includes a constraining component connected to the base and disposed inside the covering component. The actuating component is movably located inside the constraining component. The constraining component is a sleeve structure, or a clipping structure with loose fit function.

According to the claimed invention, the electronic switch further includes a pressure detecting unit and a processing unit. The pressure detecting unit is disposed on the base, and adapted to acquire a value of an external force applied to the actuating component according to a distance variation between the actuating component and the base. The processing unit is electrically connected to the pressure detecting unit and adapted to output a control signal according to a result of the pressure detecting unit. The pressure detecting unit is an optical detection module, an electromagnetic induction module or a capacitance detection module The electronic switch of the present invention provides the adjustable inverse feedback force to simulate the pressure retardation of the keyswitch and the brushwork variation of the touch pen, so as to improve diversity and market competition of the product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
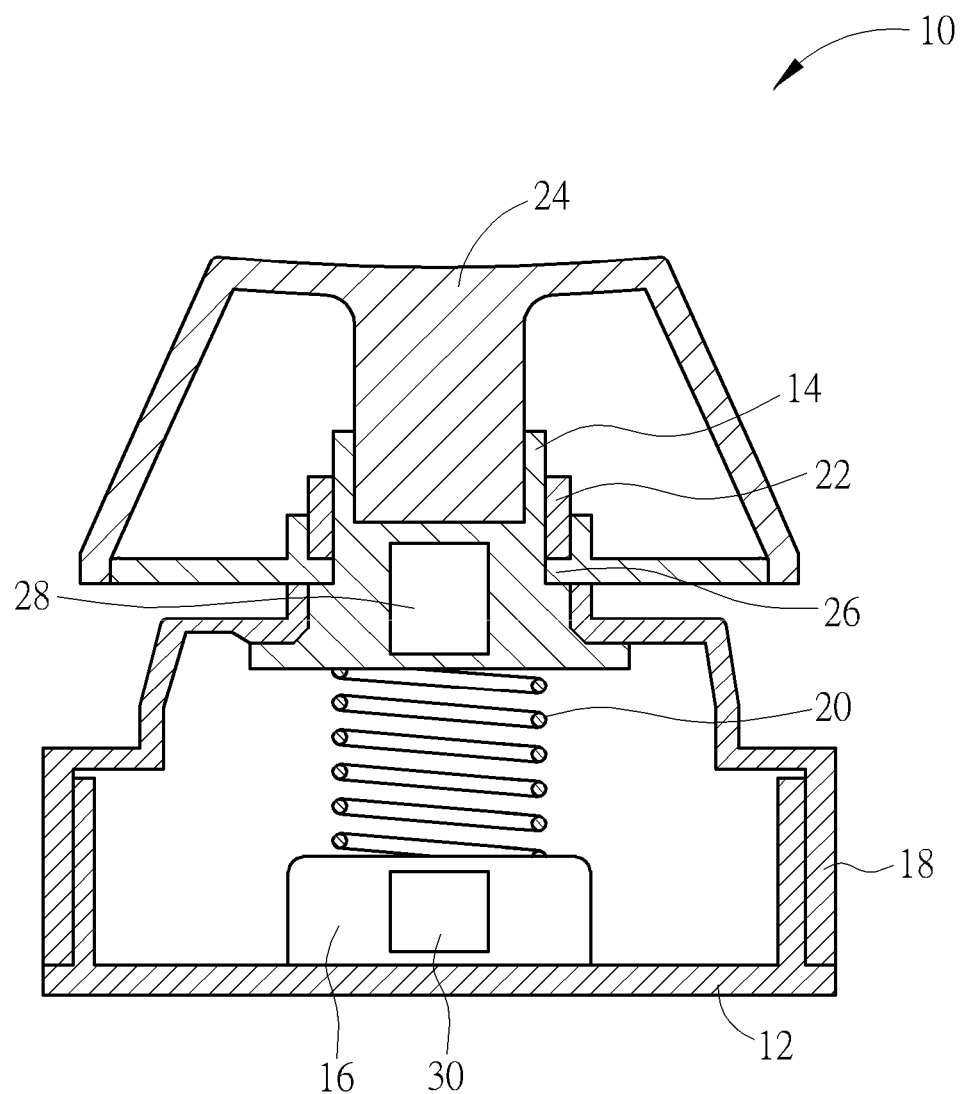
FIG. 1 and FIG. 2 respectively are diagrams of the electronic switch in different operation modes according to a first embodiment of the present invention.
Figure 2:
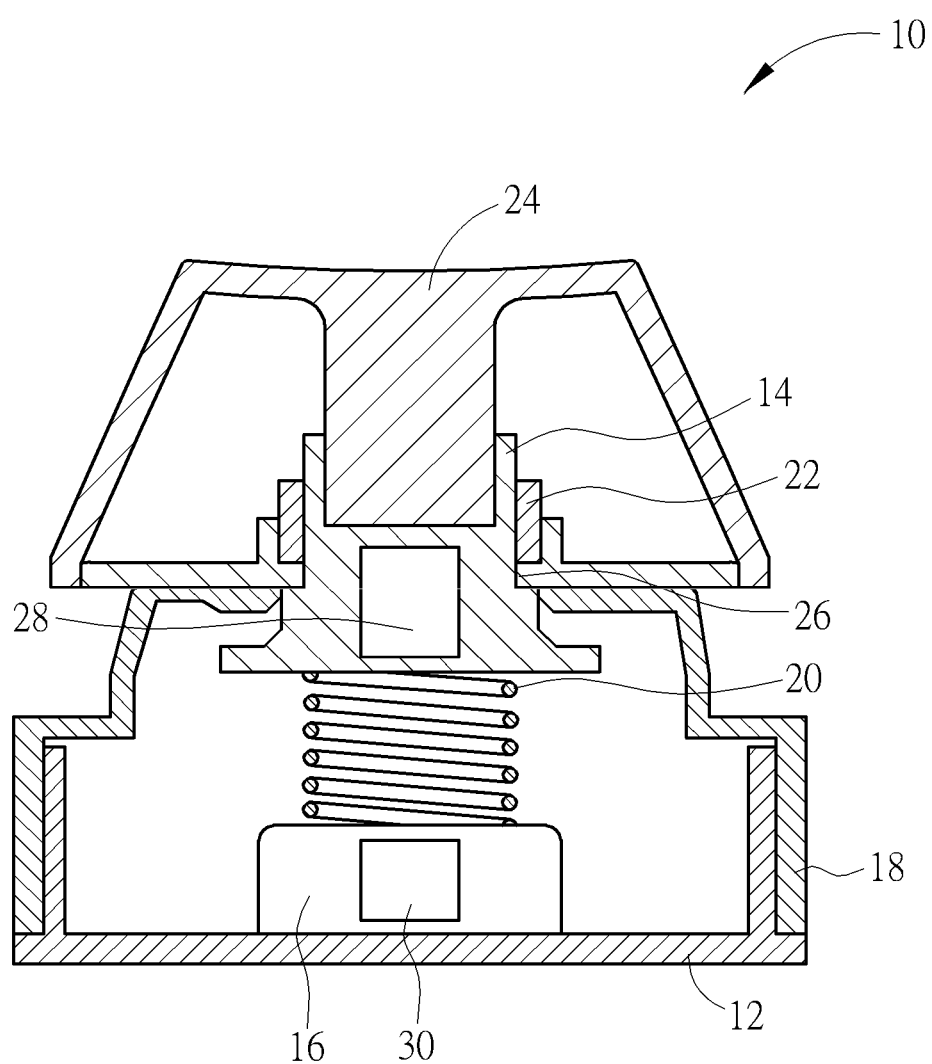

Please refer to FIG. 1 and FIG. 2. FIG. 1 and FIG. 2 respectively are diagrams of an electronic switch 10 in different operation modes according to a first embodiment of the present invention. The electronic switch 10 includes a base 12, an actuating component 14, a magnetic field generating module 16, a covering component 18, a resilient component 20 and a constraining component 22. The covering component 18 is connected with the base 12 to be a housing of the electronic switch 10. The constraining component 22 is located inside the covering component 18 and connected to the base 12 via the covering component 18. The electronic switch 10 can be a button with any form, such like the keyswitch on keyboard or the household lamplight control. A keycap 24 can be disposed on an end of the actuating component 14, and the other end of the actuating component 14 is connected to the magnetic field generating module 16 via the resilient component 20. In some embodiments, the resilient component 20 can be directly connected to the base 12; meanwhile, the magnetic field generating module 16 is slightly deviated from the resilient component 20 and still aligns with the actuating component 14 for providing an effective magnetic repulsive force.

Figure 3:
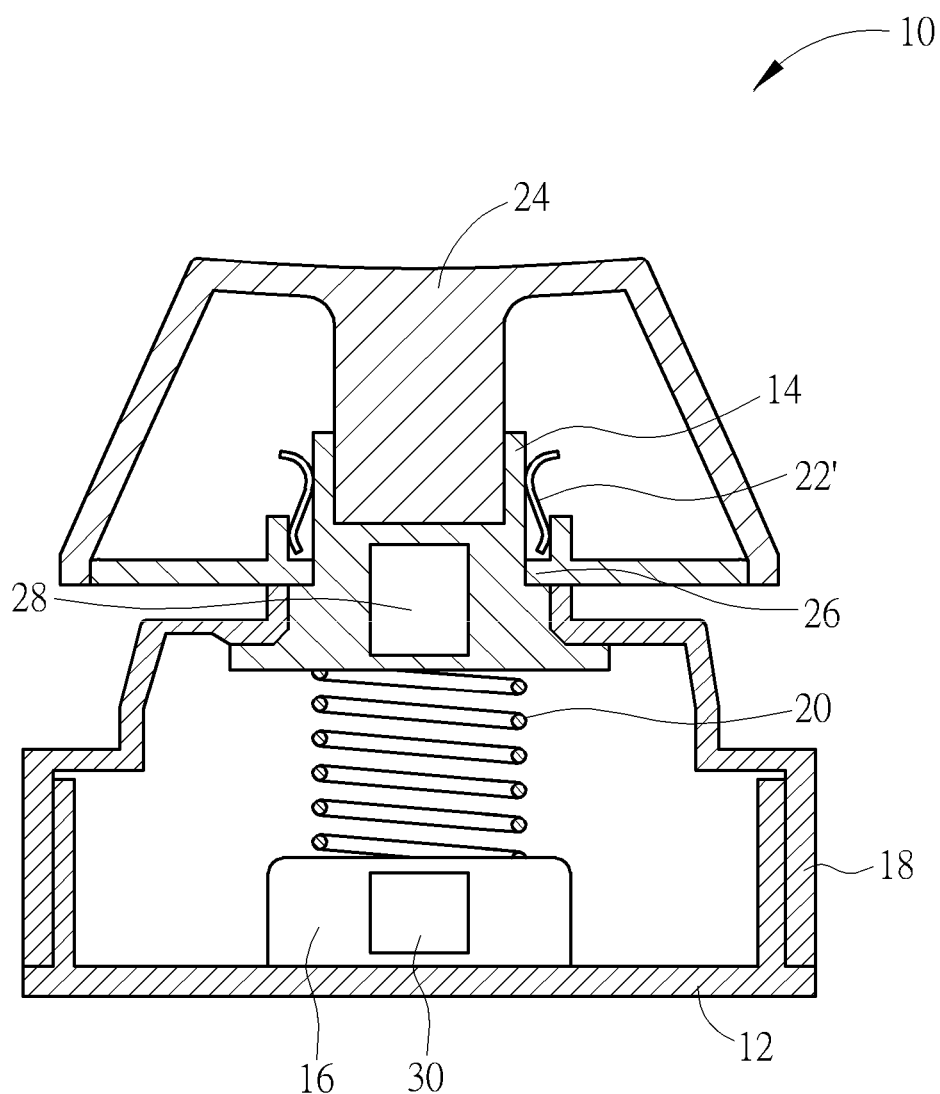
FIG. 3 is a diagram of the constraining component with another form according to an embodiment of the present invention.

In the first embodiment of the present invention, the constraining component 22 is a sleeve structure, the actuating component 14 is movably located inside the constraining component 22, and the actuating component 14 can be freely moved between the covering component 18 and the base 12 while the keycap 24 is pressed. In some embodiments, the constraining component 22' can be a clipping structure with loose fit function, as shown in FIG. 3. An elastic piece of the constraining component 22' presses over a lateral surface of the actuating component 14, so as to constrain a movement of the actuating component 14 relative to the magnetic field generating module 16 in a predetermined direction, and to ensure that the magnetic repulsive force of the magnetic field generating module 16 can be correctly transmitted toward the actuating component 14. In addition, the covering component 18 includes a contacting portion 26; while the actuating component 14 is moved relative to the constraining component 22 (or the constraining component 22') via a resilient recovering force of the resilient component 20, the actuating component 14 moving over a predetermined stroke is obstructed by the contacting portion 26, to prevent the actuating component 14 from being separated from the covering component 18.

The magnetic field generating module 16 is disposed on the base 12. The actuating component 14 can be movably connected to the base 12 via auxiliaries of the covering component 18, the resilient component 20 and the constraining component 22. The actuating component 14 includes a magnetic unit 28, and the magnetic field generating module 16 includes a magnetic structure 30 accordingly, such like the electromagnetic unit or the permanent magnet unit. The magnetic structure 30 designed as the permanent magnet unit provides the magnetic repulsive force for the magnetic unit 28, and the user can experience the inverse feedback force provided by the magnetic field generating module 16 while pressing the keycap 24. As the magnetic structure 30 is designed by the electromagnetic unit, an input current of the electromagnetic unit is able to be arbitrarily changed for adjusting a value of the magnetic repulsive force, so as to provide the variable inverse feedback force according to operational circumstances.

Figure 4:
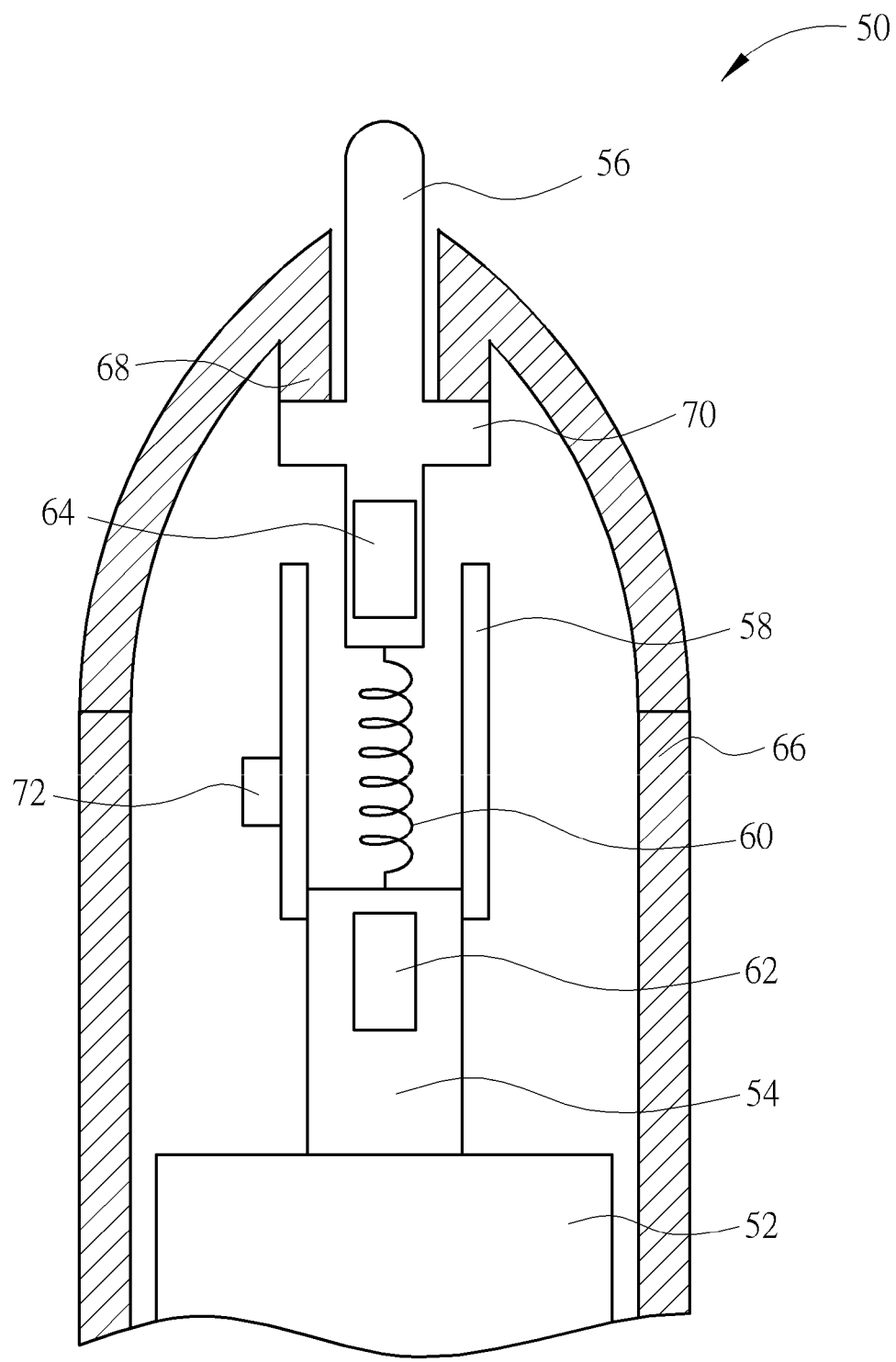
FIG. 4 and FIG. 5 respectively are diagrams of the electronic switch in different operation modes according to a second embodiment of the present invention.
Figure 5:
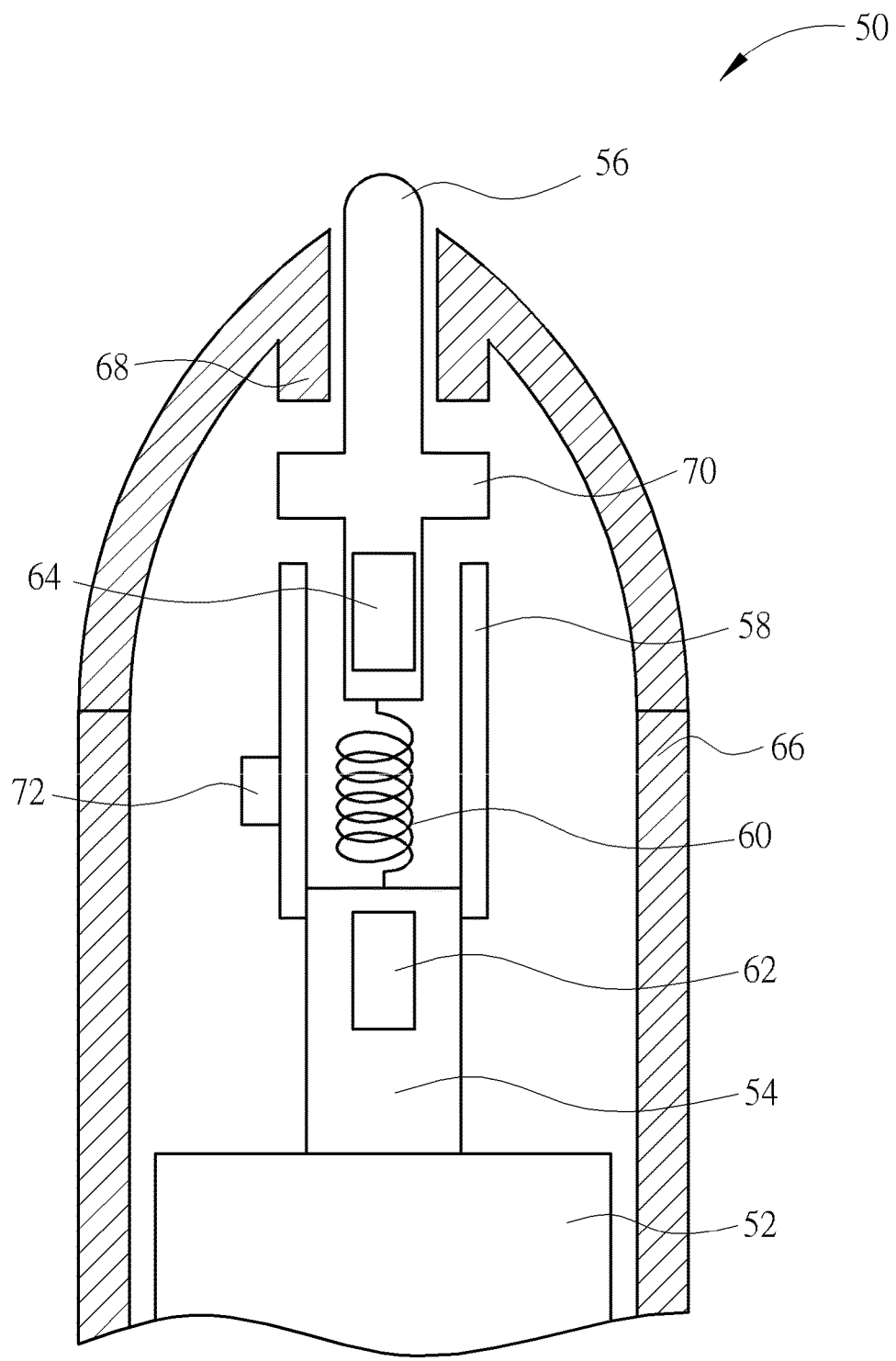

Please refer to FIG. 4 and FIG. 5. FIG. 4 and FIG. 5 respectively are diagrams of the electronic switch 50 indifferent operation modes according to a second embodiment of the present invention. The electronic switch 50 can be a touch pen. Elements of the electronic switch 50 having the same numerals as ones of the electronic switch 10 have similar structures and functions. For example, the base 52 is a foundation inside the electronic switch 50 and utilized to accommodate an energy storing component. The magnetic field generating module 54 is disposed on the base 52, and the actuating component 56 can be freely moved relative to the magnetic field generating module 54 via the constraining component 58 and the resilient component 60. The constraining component 58 can be the sleeve structure or the clipping structure with the loose fit function, which is similar to the constraining component of the first embodiment. The magnetic structure 62 of the magnetic field generating module 54 provides the magnetic repulsive force for the magnetic unit 64 of the actuating component 56; the actuating component 56 is moved into the covering component 66 while a tip of the touch pen is pressed, and the magnetic repulsive force of the magnetic field generating module 54 provides the inverse feedback force for the actuating component 56, so as to retard motion of the actuating component 56 and to control hardness of the touch pen's brushwork accordingly.

Difference between the second embodiment and the first embodiment is that the covering component 66 of the electronic switch 50 is a pen shell, and a contacting portion 68 is disposed on a front inside the pen shell. While the resilient recovering force of the resilient component 60 moves the actuating component 56 out of the pen shell, the contacting portion 68 is utilized to contact against a protrusion 70 of the actuating component 56, to avoid the actuating component 56 and the covering component 66 from separation. As the magnetic structure 62 is designed by the permanent magnet unit, the magnetic field generating module 54 provides the changeless magnetic repulsive force for the actuating component 56; as the magnetic structure 62 is designed by the electromagnetic unit, the value of the magnetic repulsive force is changed by adjustment of the input current. Therefore, brushwork characteristic can be simulated via the magnetic field generating module 54, for example, since the electronic switch 50 executes an application program of brush writing, the magnetic field generating module 54 provides the slight magnetic repulsive force, allowable distance of the actuating component 56 is increased accordingly, and the operator experiences the soft brushwork while using the electronic switch 50; since the electronic switch 50 executes an application program of fountain pen writing, the magnetic field generating module 54 provides the heavy magnetic repulsive force, the allowable distance of the actuating component 56 is decreased accordingly, and the operator experiences the tough brushwork while using the electronic switch 50.

The electronic switch 50 (the touch pen) not only provides the force feedback function, but also generates the writing trace with variable width according to physical strength applied to the electronic switch 50. The electronic switch 50 further can include a pressure detecting unit 72 and a processing unit 74. The pressure detecting unit 72 is preferably disposed on the constraining component 58 close to the actuating component 56, which means the pressure detecting unit 72 can be connected to the base 52 via the constraining component 58 for obtaining energy. The pressure detecting unit 72 detects a distance variation between the actuating component 56 and the base 52 to acquire a value of the physical strength (such like the external force) applied to the actuating component 56. Because the actuating component 56 is movably located inside the constraining component 58, the relative movement between the actuating component 56 and the constraining component 58 is utilized, but not limited, to transform into the value of the physical strength. The processing unit 74 is electrically connected to the pressure detecting unit 72. The processing unit 74 can output the control signal according to a detective result of the pressure detecting unit 72, for controlling an external electronic device (such as the screen) to display the writing trace with specific width.

It should be mentioned that the pressure detecting unit 72 and the processing unit 74 of the second embodiment can be applied to the electronic switch 10 of the first embodiment, a combination mentioned as above is not shown in figures. The pressure detecting unit 72 can be disposed on the constraining component 22 or the covering component 18 of the electronic switch 10, the processing unit 74 is electrically connected to the pressure detecting unit 72 to acquire the detective result of the pressure detecting unit 72, so as to determine whether the keycap 24 is pressed slightly or largely via the movement of the actuating component 14 and to accordingly interpret the control command input by the user in the specific operational circumstances. The inverse feedback force of the magnetic field generating module 16 provided by the magnetic field generating module 16 to apply for the actuating component 14B is varied according to the physical strength pressing upon the keycap 24, and the user can experience the force feedback according to the application program executed by the electronic switch 10. The foresaid application program generally can be a video game.

Figure 6:
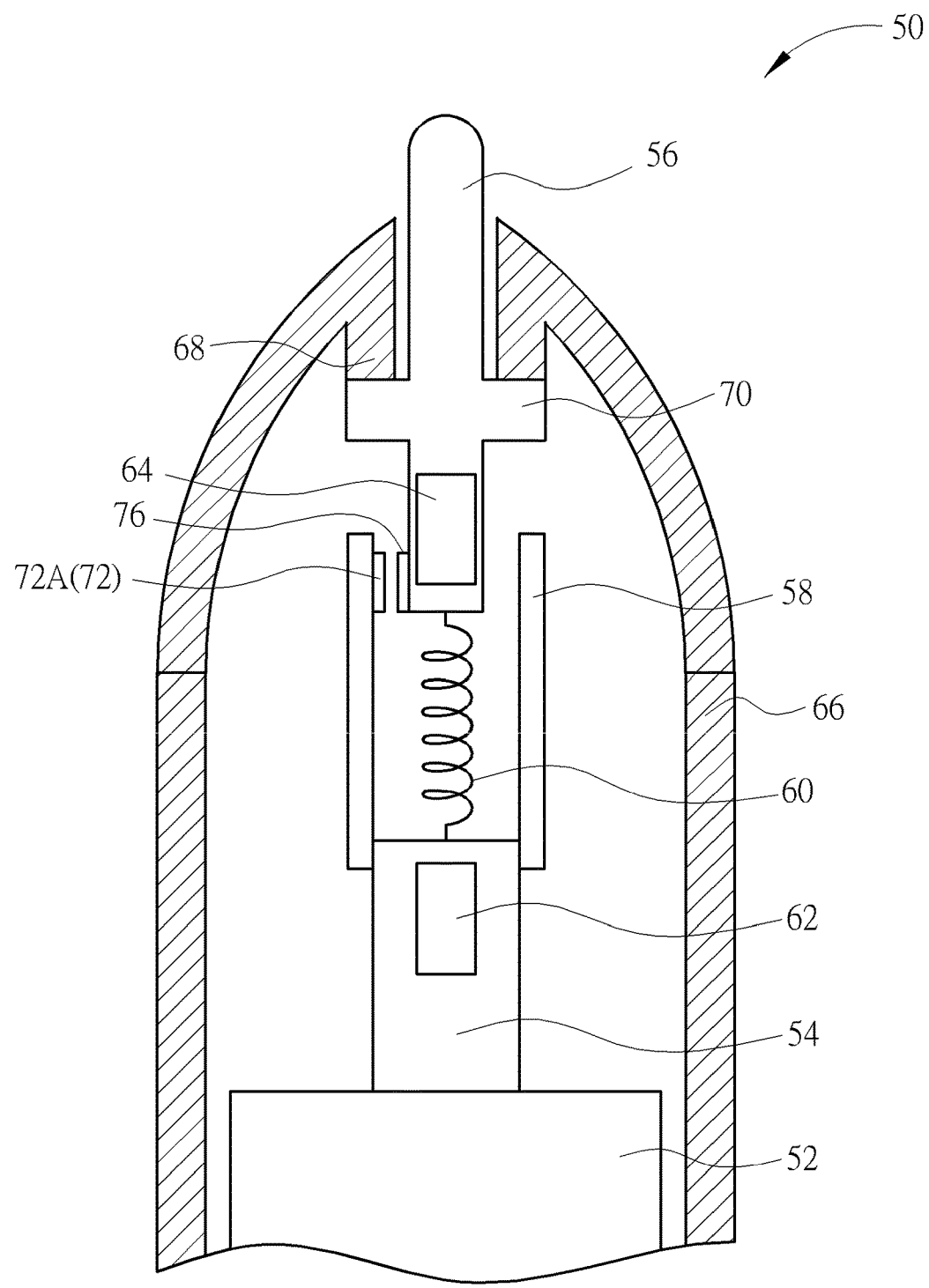
FIG. 6 to FIG. 8 respectively are diagrams of the pressure detecting unit according to different embodiments of the present invention.
Figure 7:
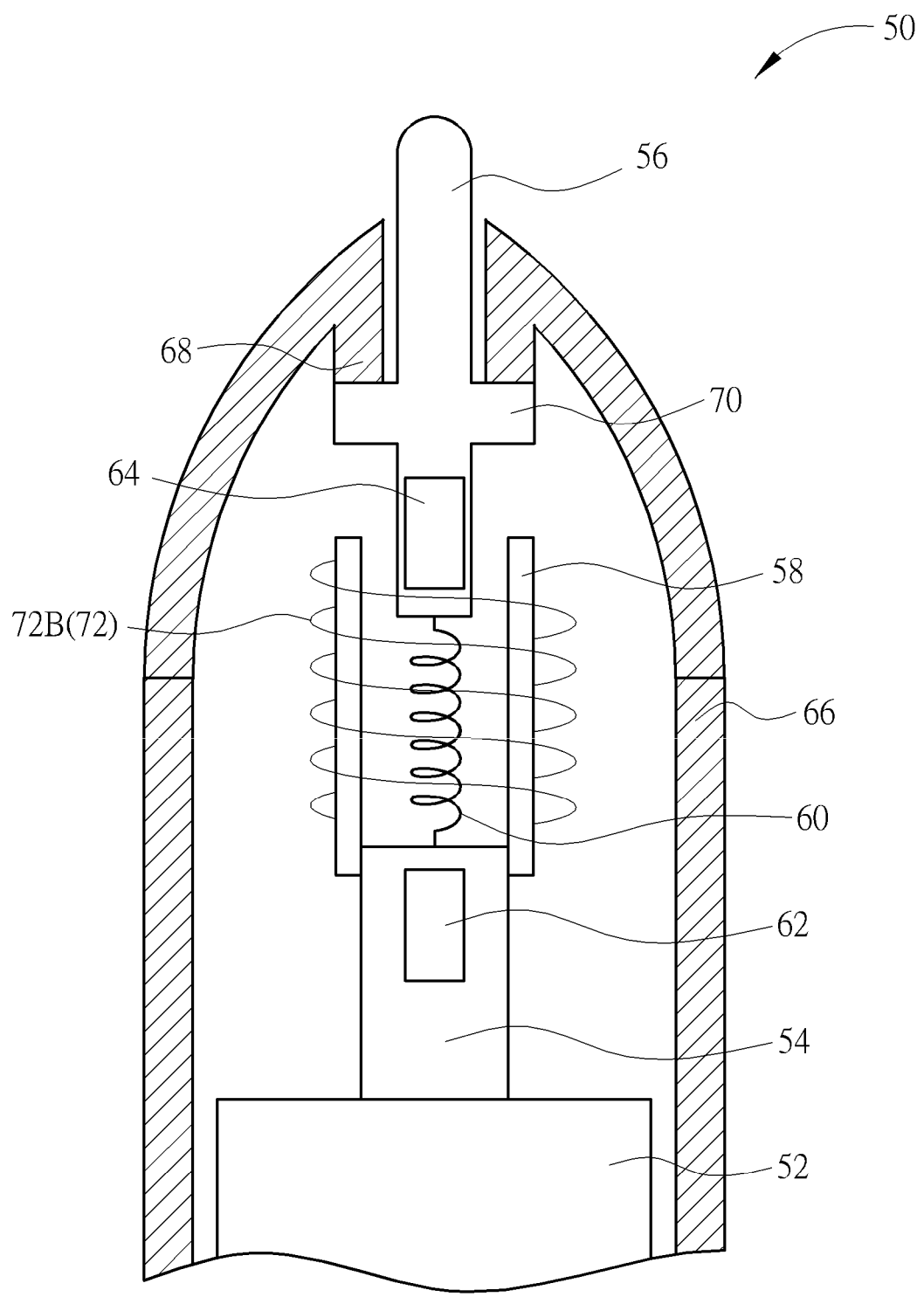
Figure 8:
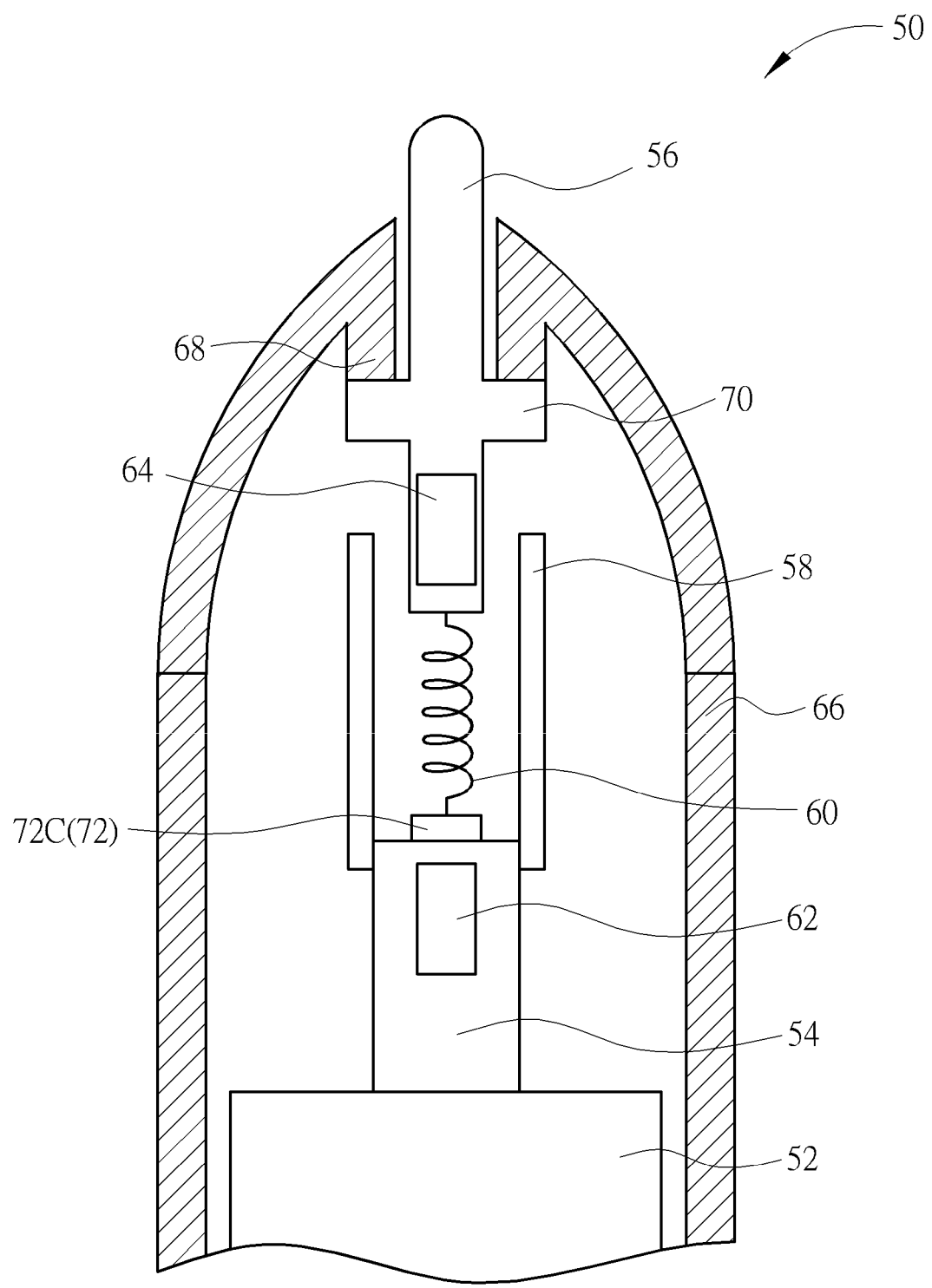

Please refer to FIG. 6 to FIG. 8. FIG. 6 to FIG. 8 respectively are diagrams of the pressure detecting unit 72 according to different embodiments of the present invention. As shown in FIG. 6, the pressure detecting unit 72 is an optical detection module 72A, a reference pattern 76 is formed on a surface of the actuating component 56, and the optical detection module 72A faces toward the reference pattern 76 on the actuating component 56. While the actuating component 56 is moved relative to the magnetic field generating module 54 and the constraining component 58, the optical detection module 72A analyzes position variation of the reference pattern 76 to acquire the value of the external force, which is applied to the electronic switch 50 and resulted in the movement of the actuating component 56. As shown in FIG. 7, the pressure detecting unit 72 is an electromagnetic induction module 72B. The electromagnetic induction module 72B utilizes an induction coil or the Hall Effect sensor to generate the induced current corresponding to magnetic field variation resulted from the movement of the actuating component 56. The induced current is varied according to the movement quantity of the actuating component 56, so the value of the external force applied to the electronic switch 50 can be acquired properly. As shown in FIG. 8, the pressure detecting unit 72 is a capacitance detection module 72C disposed on a position facing the actuating component 56, capacitors of the capacitance detection module 72C are preferably distributed over the actuating component 56 and the magnetic field generating module 54, and the value of the external force is acquired by analyzing capacitance variation resulted from the movement of the actuating component 56.

In conclusion, the electronic switch of the present invention preferably can be used as the keyswitch on keyboard and the digital touch pen. The actuating component of the electronic switch is connected to the keycap or tip of the touch pen, and is separated from the base. As the keyswitch is pressed or the touch pen is operated, the actuating component is moved close to and away from the base in a unidirectional movable manner via constraint of the constraining component, which means the actuating component is inserted into the covering component by linear motion and partially removed out of the covering component via the resilient component and/or the magnetic field generating module. The actuating component has the magnetic unit, the magnetic structure of the magnetic field generating module provides the magnetic repulsive force for the magnetic unit; although the actuating component can be freely moved close to the covering component, motion activity of the actuating component is resisted by the magnetic repulsive force to simulate pressure retardation of the keyswitch and brushwork control of the touch pen.

Moreover, the pressure detecting unit detects the pressure on the actuating component, and then the processing unit can accordingly transform the pressure into the value of the external force applied to the keyswitch and the specific width about the writing trace. The pressure detecting unit may utilize the optical detection technique, the electromagnetic induction technique or the capacitance detection technique to acquire the relative movement of the actuating component and calculate the external force applied to the actuating component. Comparing to the prior art, the electronic switch of the present invention provides the adjustable inverse feedback force to simulate the pressure retardation of the keyswitch and the brushwork variation of the touch pen, so as to improve diversity and market competition of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic switch with force feedback function, comprising:
   a base;
   an actuating component movably connected to the base, the actuating component comprising a magnetic unit; and
   a magnetic field generating module disposed on the base and adapted to provide a magnetic repulsive force for the magnetic unit so as to generate an inverse feedback force while the actuating component moves close to the base;
   wherein the magnetic field generating module utilizes an electromagnetic unit to generate the magnetic repulsive force corresponding to the magnetic unit, and the magnetic field generating module adjusts an input current of the electromagnetic unit to vary a value of the magnetic repulsive force.

2. The electronic switch of claim 1, wherein the actuating component is spaced from the base, and the actuating component is moved close to or away from the base in a unidirectional movable manner.

3. The electronic switch of claim 1, wherein the magnetic field generating module utilizes a permanent magnet unit to generate the magnetic repulsive force corresponding to the magnetic unit.

4. The electronic switch of claim 1, further comprising:
   a covering component connected to the base, the covering component comprising a contacting portion, and the actuating component being movably located between the covering component and the base; and
   a resilient component, two ends of the resilient component being respectively connected to the actuating component and the magnetic field generating module, so as to contact the actuating component against the contacting portion.

5. The electronic switch of claim 4, further comprising:
   a constraining component connected to the base and disposed inside the covering component, the actuating component being movably located inside the constraining component.

6. The electronic switch of claim 5, wherein the constraining component is a sleeve structure, or a clipping structure with loose fit function.

7. The electronic switch of claim 1, further comprising:
   a pressure detecting unit disposed on the base and adapted to acquire a value of an external force applied to the actuating component according to a distance variation between the actuating component and the base; and
   a processing unit electrically connected to the pressure detecting unit and adapted to output a control signal according to a result of the pressure detecting unit.

8. The electronic switch of claim 7, wherein the pressure detecting unit is an optical detection module, the optical detection module analyzes a movement of a reference pattern formed on the actuating component to acquire the value of the external force.

9. The electronic switch of claim 7, wherein the pressure detecting unit is an electromagnetic induction module, the electromagnetic induction module utilizes magnetic field variation resulted by a movement of the actuating component to generate an induced current, and acquires the value of the external force according to a quantity of the induced current.

10. The electronic switch of claim 9, wherein the electromagnetic induction module comprises an induction coil or a Hall Effect sensor.

11. The electronic switch of claim 7, wherein the pressure detecting unit is a capacitance detection module disposed on a position facing the actuating component, the capacitance detection module acquires the value of the external force according to capacitance variation resulted by the movement of the actuating component.

12. An electronic switch with force feedback function, comprising:
   an actuating component comprising a magnetic unit; and
   a magnetic field generating module spaced from the actuating component and adapted to provide a magnetic repulsive force for the magnetic unit so as to generate an inverse feedback force while the actuating component moves close to the magnetic field generating module;
   wherein the magnetic field generating module utilizes an electromagnetic unit to generate the magnetic repulsive force corresponding to the magnetic unit, and the magnetic field generating module adjusts an input current of the electromagnetic unit to vary a value of the magnetic repulsive force.

13. The electronic switch of claim 12, wherein the magnetic field generating module utilizes a permanent magnet unit to generate the magnetic repulsive force corresponding to the magnetic unit.

14. The electronic switch of claim 12, further comprising:
   a covering component comprising a contacting portion, and the actuating component being movably disposed on the covering component; and
   a resilient component, two ends of the resilient component being respectively connected to the actuating component and the magnetic field generating module, so as to contact the actuating component against the contacting portion.

15. The electronic switch of claim 14, further comprising:
   a constraining component disposed inside the covering component, the actuating component being movably located inside the constraining component.

16. The electronic switch of claim 12, further comprising:
   a pressure detecting unit disposed by the actuating component and adapted to acquire a value of an external force applied to the actuating component according to a motion of the actuating component; and
   a processing unit electrically connected to the pressure detecting unit and adapted to output a control signal according to a result of the pressure detecting unit.

17. The electronic switch of claim 16, wherein the pressure detecting unit is an optical detection module or an electromagnetic induction module.

18. The electronic switch of claim 17, wherein the electromagnetic induction module comprises an induction coil or a Hall Effect sensor.

19. The electronic switch of claim 16, wherein the pressure detecting unit is a capacitance detection module disposed on a position facing the actuating component, the capacitance detection module acquires the value of the external force according to capacitance variation resulted by the movement of the actuating component.

* * * * *